(12) United States Patent
Kwak

(10) Patent No.: US 7,550,798 B2
(45) Date of Patent: Jun. 23, 2009

(54) CMOS IMAGE SENSOR AND METHOD FOR MANUFACTURING THE SAME

(75) Inventor: Sung Ho Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/580,177

(22) Filed: Oct. 11, 2006

(65) Prior Publication Data
US 2007/0096179 A1 May 3, 2007

(30) Foreign Application Priority Data
Oct. 12, 2005 (KR) .................. 10-2005-0095898

(51) Int. Cl.
*H01L 31/062* (2006.01)
(52) U.S. Cl. .................. 257/292; 257/291; 257/296; 257/362; 257/290; 257/395
(58) Field of Classification Search .................. 257/292, 257/291, 461
See application file for complete search history.

(56) References Cited

U.S. PATENT DOCUMENTS

| | | | | |
|---|---|---|---|---|
| 3,432,792 A | * | 3/1969 | Hatcher, Jr. ................ | 338/311 |
| 5,210,434 A | * | 5/1993 | Ohmi et al. ................ | 257/291 |
| 5,614,744 A | * | 3/1997 | Merrill ..................... | 257/291 |
| 5,625,210 A | * | 4/1997 | Lee et al. .................. | 257/292 |
| 5,903,021 A | * | 5/1999 | Lee et al. .................. | 257/292 |
| 5,904,493 A | * | 5/1999 | Lee et al. .................. | 438/57 |
| 6,024,887 A | * | 2/2000 | Kuo et al. .................. | 216/48 |
| 6,380,572 B1 | * | 4/2002 | Pain et al. .................. | 257/292 |
| 6,441,412 B2 | * | 8/2002 | Oh et al. .................... | 257/292 |
| 6,844,580 B2 | * | 1/2005 | Rhodes ...................... | 257/291 |
| 6,900,485 B2 | * | 5/2005 | Lee ........................... | 257/292 |
| 6,949,764 B2 | * | 9/2005 | Ning ......................... | 257/47 |
| 2004/0104413 A1 | * | 6/2004 | Rhodes et al. .............. | 257/292 |
| 2005/0001246 A1 | * | 1/2005 | Mouli ....................... | 257/291 |
| 2005/0156213 A1 | * | 7/2005 | Han et al. .................. | 257/292 |
| 2006/0110873 A1 | * | 5/2006 | Han ........................... | 438/199 |
| 2007/0069300 A1 | * | 3/2007 | Cheng et al. ................ | 257/368 |

FOREIGN PATENT DOCUMENTS

| KR | 10-1998-0005563 | 7/2000 |
|---|---|---|
| KR | 10-2002-0023239 | 11/2003 |

\* cited by examiner

*Primary Examiner*—Hoai V Ho
*Assistant Examiner*—Fernando N Hidalgo
(74) *Attorney, Agent, or Firm*—Saliwanchik, Lloyd & Saliwanchik

(57) ABSTRACT

Provided is a CMOS image sensor and method for manufacturing the same. The CMOS image sensor includes a semiconductor substrate, a gate electrode formed on the semiconductor substrate, a conductive diffusion region formed in a photodiode area of the semiconductor substrate, a floating diffusion region formed in a transistor region of the semiconductor substrate, and an oxide region formed in the semiconductor substrate below the floating diffusion region.

16 Claims, 5 Drawing Sheets

CMOS IMAGE SENSOR AND METHOD FOR MANUFACTURING THE SAME

RELATED APPLICATION

This application claims the benefit under 35 U.S.C. §119(e), of Korean Patent Application Number 10-2005-0095898 filed Oct. 12, 2005, which is incorporated herein by reference in its entirety.

FIELD OF THE INVENTION

The present invention relates to a CMOS image sensor and a method for manufacturing the same.

BACKGROUND OF THE INVENTION

In general, an image sensor is a semiconductor device for converting optical images into electric signals, and is typically classified as a charge coupled device (CCD) or a CMOS image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes and vertically arranged in the matrix so as to transmit electric charges in the vertical direction when the electric charges are generated from each photodiode; a plurality of horizontal charge coupled devices (HCCDs) for transmitting in the horizontal direction the electric charges that have been transmitted from the VCCDs; and a sense amplifier for outputting electric signals by sensing the electric charges being transmitted in the horizontal direction.

However, such a CCD has various disadvantages, such as a complicated drive mode, high power consumption, and so forth. Also, the CDD requires multi-step photo processes, so the manufacturing process for the CCD is complicated.

In addition, since it is difficult to integrate a controller, a signal processor, and an analog/digital converter (A/D converter) onto a single chip of the CCD, the CCD is unsuitable for compact-size products.

Recently, the CMOS image sensor has been spotlighted as a next-generation image sensor capable of solving the problem of the CCD.

The CMOS image sensor is a device employing a switching mode to sequentially detect an output of each unit pixel by means of MOS transistors using peripheral devices such as a controller and a signal processor, in which the MOS transistors are formed on a semiconductor substrate corresponding to the unit pixels through a CMOS technology.

That is, the CMOS sensor includes a PD and a MOS transistor in each unit pixel, and sequentially detects the electric signals of each unit pixel through the MOS transistor in a switching mode.

The CMOS image sensors are classified into 3T type, 4T type, and 5T type CMOS image sensors according to the number of transistors included in each pixel. The 4T type CMOS image sensor includes one PD and four transistors.

FIG. 1 is a circuit diagram showing a unit pixel of the conventional CMOS image sensor including a PD, which is a photodetector, and four n-channel metal-oxide semiconductor (NMOS) transistors.

As shown in FIG. 1, from among four NMOS transistors, a transfer transistor Tx transmits optical charges from the PD to the floating diffusion (FD).

A reset transistor Rx transmits a signal for resetting the FD to the level of a supply voltage $V_{DD}$, a drive transistor Dx serves as a source follower, and a select transistor Sx receives a pixel data enable signal so as to transmit a pixel data signal.

Hereinafter, the operation of the CMOS image sensor having the above structure will be described.

First, the reset transistor Rx, the transfer transistor Tx, and the select transistor Sx are turned on so as to reset a unit pixel. At this time, depletion of the PD occurs, so that carrier charging is generated. The FD is charged with carriers to a level of the supply voltage $V_{DD}$.

Next, the transfer transistor Tx is turned off, the select transistor Sx is turned on, and then the reset transistor Rx is turned off.

In this state, a controller reads out an output voltage V1 from the output terminal Out of the unit pixel and stores the output voltage V1 in a buffer. Then, the controller turns on the transfer transistor Tx so as to shift carriers of a capacitor Cp, which is changed according to intensity of light, into a capacitor Cf. After that, the controller reads out an output voltage V2 from the output terminal Out of the unit pixel and converts analog data for the output voltages V1 and V2 into digital data, thereby completing one operational period of the unit pixel.

FIGS. 2 to 6 are views showing a method for manufacturing the conventional CMOS image sensor.

As shown in FIG. 2, a low-density P− type epitaxial layer 62 is formed on a high-density P++ type semiconductor substrate 61 by performing an epitaxial process.

Then, an active area and an isolation area are defined on the semiconductor substrate 61, and an isolation layer 63 is formed on the isolation area through a shallow trench isolation (STI) process.

A gate insulating layer 64 and a conductive layer are sequentially deposited on the entire surface of the epitaxial layer 62 formed with the isolation layer 63, and the conductive layer and the gate insulating layer 64 are selectively removed, thereby forming a gate electrode 65.

As shown in FIG. 3, a first photoresist film 66 is coated on the entire surface of the semiconductor substrate 61, and then an exposure and development process is performed with respect to the photoresist film such that blue, green, and red PD areas can be exposed.

Thereafter, low-density N− type dopants are implanted into the epitaxial layer 62 by using the first photoresist film 66 as a mask, thereby forming an N− type diffusion area 67.

Then, as shown in FIG. 4, after completely removing the first photoresist film 66 and depositing an insulating layer on the entire surface of the semiconductor substrate 61, insulating sidewalls 68 are formed at both sides of the gate electrode 65 by performing an etch-back process.

Next, a second photoresist film 69 is coated on the entire surface of the semiconductor substrate 61, and an exposure and development process is performed with respect to the second photoresist film 69 such that a source/drain area of the transistors can be exposed while covering the PD areas.

Thereafter, high-density N+ type dopants are implanted into the exposed source/drain area by using the second photoresist film 69 as a mask, thereby forming an N+ type diffusion area (i.e., an FD area) 70.

Then, as shown in FIG. 5, after removing the second photoresist film 69, a third photoresist film 71 is coated on the entire surface of the semiconductor substrate 61, and then the exposure and development process is performed with respect to the third photoresist film 71 such that the PD areas can be exposed.

Next, P type dopants are implanted into the PD areas formed with the N− type diffusion area 67 by using the third photoresist film 71 as a mask, thereby forming a $P_o$ type diffusion area 72 on the surface of the semiconductor substrate.

Then, as shown in FIG. 6, the third photoresist film 71 is removed, and a heat treatment process is performed with respect to the semiconductor substrate 61, thereby diffusing the dopant diffusion areas.

However, in the conventional CMOS image sensor, since the voltage variation increases as capacitance of the FD area reduces under the same number of electrons, it is difficult to reduce the node capacitance of the FD area.

In addition, since the voltage variation derived from electrons exclusively generated from the PD area due to an optical energy is reduced as the node capacitance of the FD area is increased, the overall sensitivity of the image sensor may be degraded.

SUMMARY OF THE INVENTION

Accordingly, the present invention is directed to a CMOS image sensor that addresses and/or substantially obviates the above-mentioned problems occurring in the prior art, and an object of the present invention is to provide a CMOS image sensor capable of reducing node capacitance of a floating diffusion area.

According to the preferred embodiment of the present invention, there is provided a CMOS image sensor comprising: a semiconductor substrate, a gate electrode formed on the semiconductor substrate, a conductive diffusion region formed in a photodiode area of the semiconductor substrate, a floating diffusion region formed in a transistor region of the semiconductor substrate, and an oxide region formed below the floating diffusion region.

According to another aspect of the present invention, there is provided a method for manufacturing a CMOS image sensor, the method comprising: implanting oxygen-based dopants into a predetermined area of a transistor region of a semiconductor substrate, forming a gate electrode on the transistor region with a gate insulating layer formed therebetween, forming a first conductive diffusion region by implanting dopants into a photodiode area of the semiconductor substrate, and forming a floating diffusion region by implanting dopants into the transistor region.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, description about a CMOS image sensor will be made with reference to the accompanying drawings according to the present invention.

Figure 1:
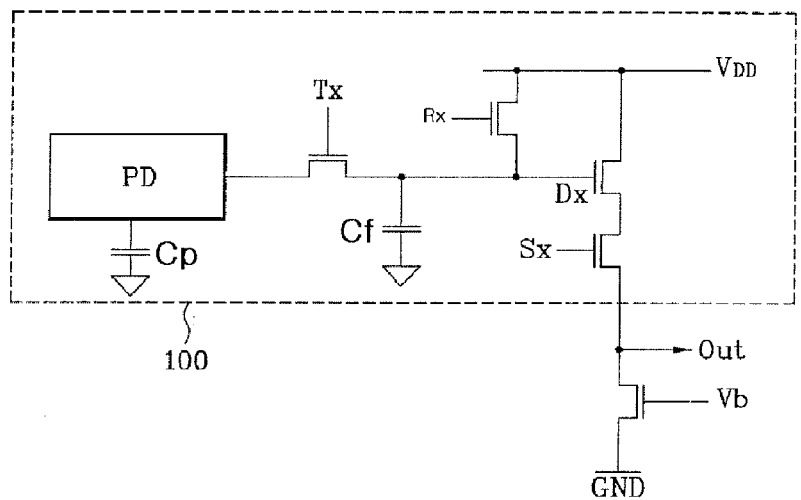
FIG. 1 is a circuit diagram showing a unit pixel of a conventional CMOS image sensor.
Figure 2:
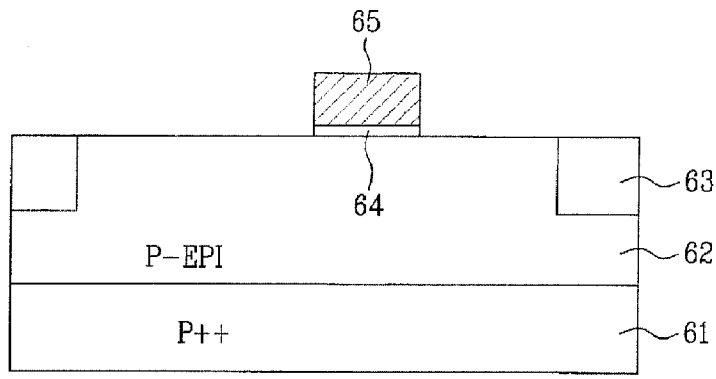
FIGS. 2 to 6 are views showing a method for manufacturing the conventional CMOS image sensor.
Figure 3:
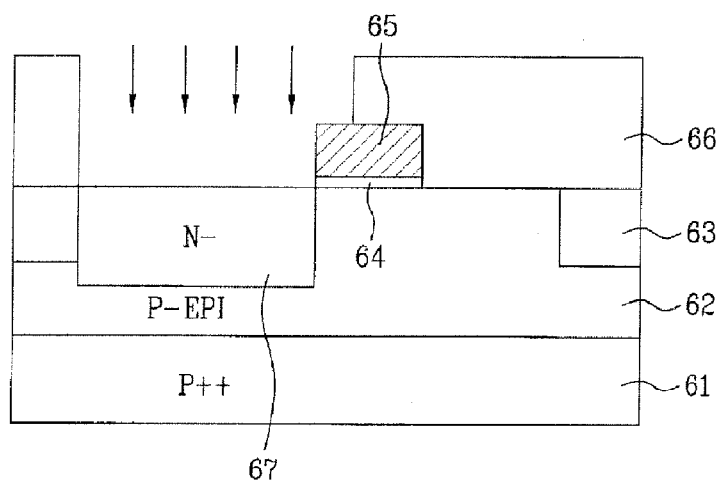
Figure 4:
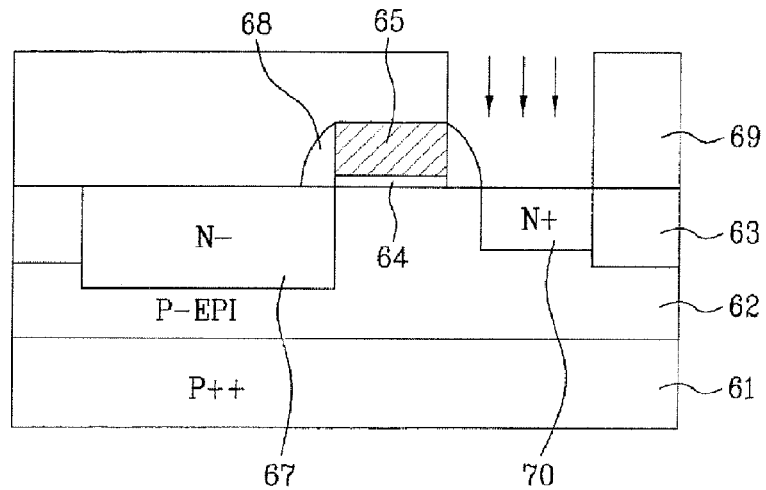
Figure 5:
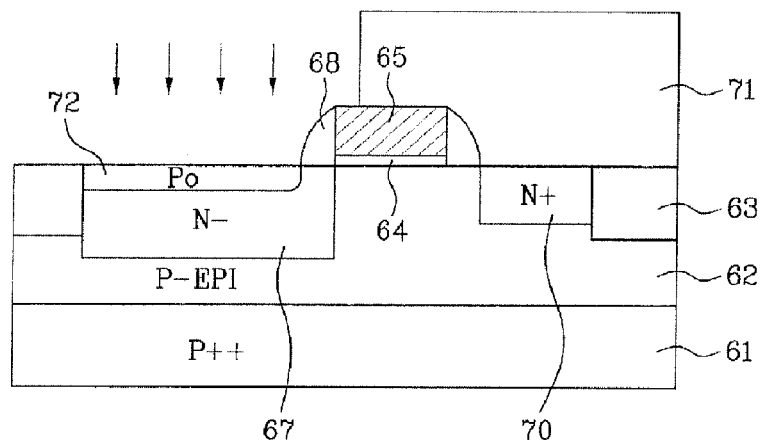
Figure 6:
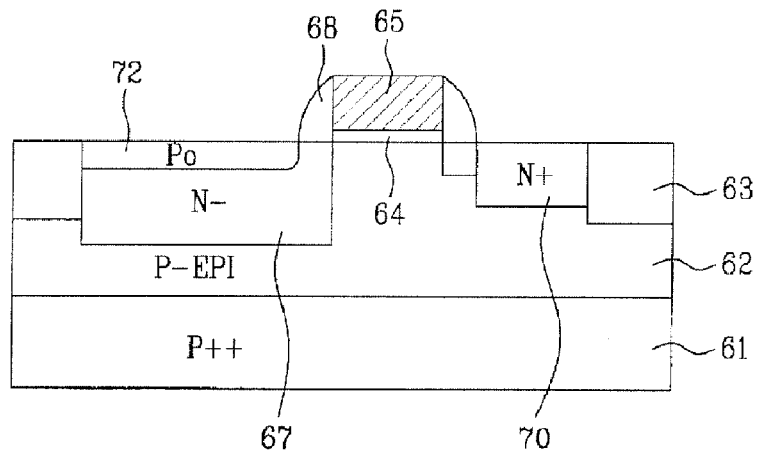
Figure 7:
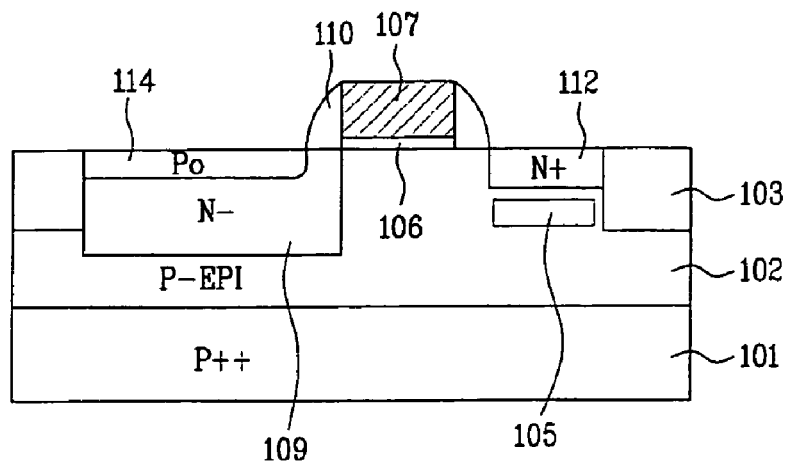
FIG. 7 is a view showing a CMOS image sensor according to an embodiment of the present invention.

FIG. 7 shows a structure of a CMOS image sensor according to an embodiment of the present invention.

As shown in FIG. 7, the CMOS image sensor according to an embodiment of the present invention includes a semiconductor substrate 101 on which a photodiode (PD) region, a transistor region, and an isolation region are defined.

The PD region of the semiconductor substrate 101 can be formed of a conductive diffusion region, and the transistor region of the semiconductor substrate 101 can be formed of an oxide region and a floating diffusion (FD) region.

Hereinafter, the structure of the image sensor suggested in the present invention will be described in detail.

In one embodiment, the semiconductor substrate 101 can be a P++ type substrate formed by implanting high-density P type dopants, and can include a P type epitaxial layer 102 grown from the substrate 101 through an epitaxial process.

In addition, the semiconductor substrate 101 can be formed with an isolation layer 103 for defining an active region on which a transistor is formed.

A gate insulating layer 106 can be formed on the epitaxial layer 102 with a gate electrode 107 formed thereupon, and spacers 110 can be formed at both sides of the gate electrode 107.

The gate electrode 107 may perform a function of a gate electrode of a transfer transistor.

In a further embodiment, the epitaxial layer 102 can be formed with a plurality of impurity areas. In a specific embodiment, the transistor region of the semiconductor substrate 101 can be formed with an oxide region 105 by implanting oxygen-based dopants and then performing an oxidation process.

The oxide region 105 can be formed below the FD region of the semiconductor substrate 101 and can be serially connected to the FD region so as to reduce node capacitance.

In addition, the PD region of the semiconductor substrate 101 can be formed of a second conductive type diffusion region 109, in which N− type dopants are implanted into the epitaxial layer 102, and a first conductive type diffusion region 114 formed at an upper side of the second conductive diffusion region 109, in which Po type dopants are implanted.

The first conductive type diffusion region 114 and the second conductive type diffusion region 109 may perform functions of an image sensor by generating optical charges according to the depth of light penetration.

FIGS. 8 to 14 are views showing a method for manufacturing the CMOS image sensor according to an embodiment of the present invention.

Figure 8:
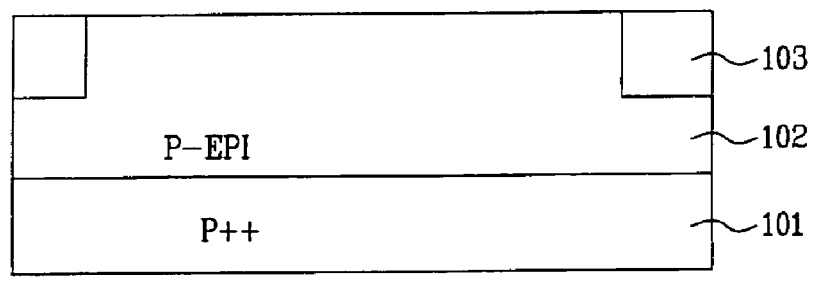
FIGS. 8 to 14 are views showing a method for manufacturing the CMOS image sensor according to an embodiment of the present invention.

Referring to FIG. 8, an epitaxial process can be performed on a semiconductor substrate. In one embodiment, the semiconductor substrate 101 can be a P++ type semiconductor substrate 101 formed by implanting high-density P type dopants. The epitaxial process can be used to form a low-density P− type epitaxial layer 102 on the semiconductor substrate 101.

Then, an isolation layer 103 can be formed by performing an STI process with respect to the semiconductor substrate 101, such that the isolation layer 103 isolates an active region.

Although it is not illustrated in figures, a method for forming the isolation layer 103 is as follows.

A pad oxide layer, a pad nitride layer, and a tetraethyl ortho silicate (TEOS) oxide layer can be sequentially formed on the semiconductor substrate 101, and a photoresist film can be formed on the TEOS oxide layer.

Then, the photoresist film can be patterned using a mask defining the active area and the isolation area. Thereafter, the pad oxide layer, the pad nitride layer, and the TEOS oxide layer in the isolation area can be selectively removed using the patterned photoresist film as a mask.

The semiconductor substrate 101 corresponding to the isolation area can be etched to a predetermined depth using the patterned pad oxide layer, pad nitride layer, and TEOS oxide layer as a mask, thereby forming a trench.

Thereafter, the trench can be filled with an insulating material, so that isolation layer 103 is formed in the trench. Subsequently, the pad oxide layer, the pad nitride layer, and the TEOS oxide layer can be removed.

Figure 9:
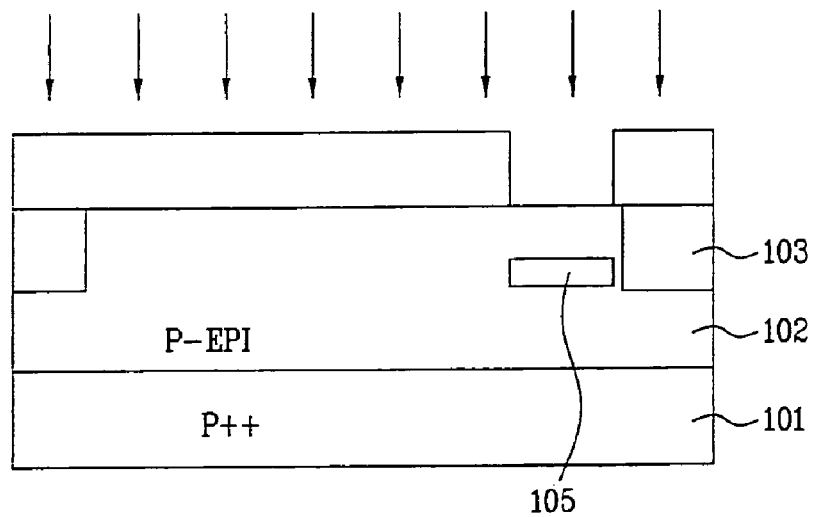

Referring to FIG. 9, a first photoresist film 104 can be coated on the entire surface of the semiconductor substrate 101 formed with the isolation layer 103, and then selectively patterned through a photolithography process, such that an FD area is exposed.

Then, oxide-based dopants can be implanted into the FD area of the exposed semiconductor substrate 101 using the first photoresist film 104 as a mask.

After the oxide-based dopants are implanted into the semiconductor substrate 101, an oxidation process can be performed such that an oxide region 105 is formed in the FD area of the semiconductor substrate 101.

The oxide region 105 is serially connected to the FD region described later, thereby reducing node capacitance.

Figure 10:
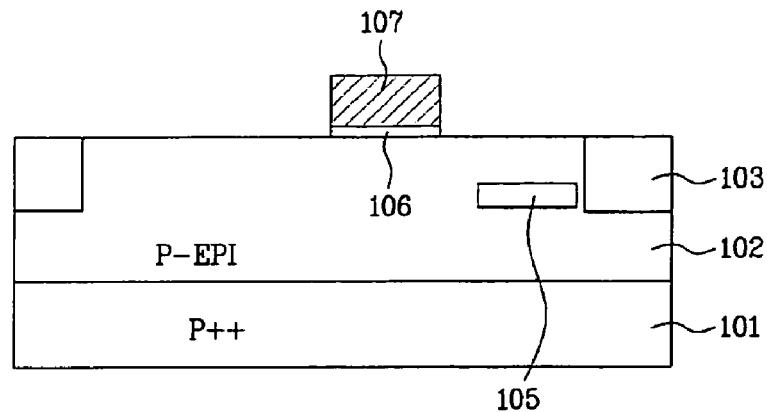

Then, referring to FIG. 10, the first photoresist film 104 can be removed, and an insulating layer and a poly-silicon layer can be sequentially formed on the epitaxial layer 102. Then, the insulating layer and the polysilicon layer can be patterned to form a gate insulating layer 106 and a gate electrode 107.

The gate electrode 107 shown in FIG. 10 may perform a function of a gate electrode of a transfer transistor.

Figure 11:
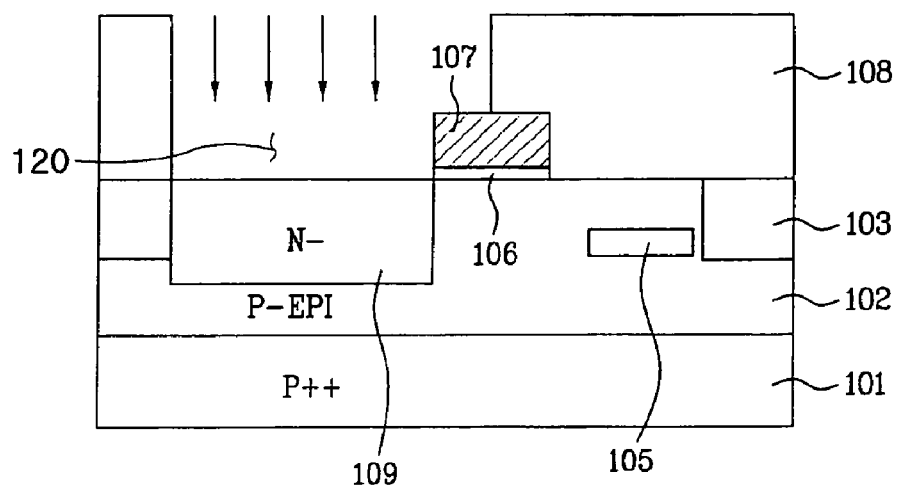

Thereafter, referring to FIG. 11, a second photoresist film 108 can be coated on the entire surface of the semiconductor substrate 101, and then patterned such that a PD region 120 is exposed.

Low-density second conductive type (in this case N-type) dopants can be implanted into the epitaxial layer 102 using the second photoresist film 108 as a mask. Accordingly, a second conductive type diffusion region 109 can be formed to a predetermined depth in the epitaxial layer 102.

Figure 12:
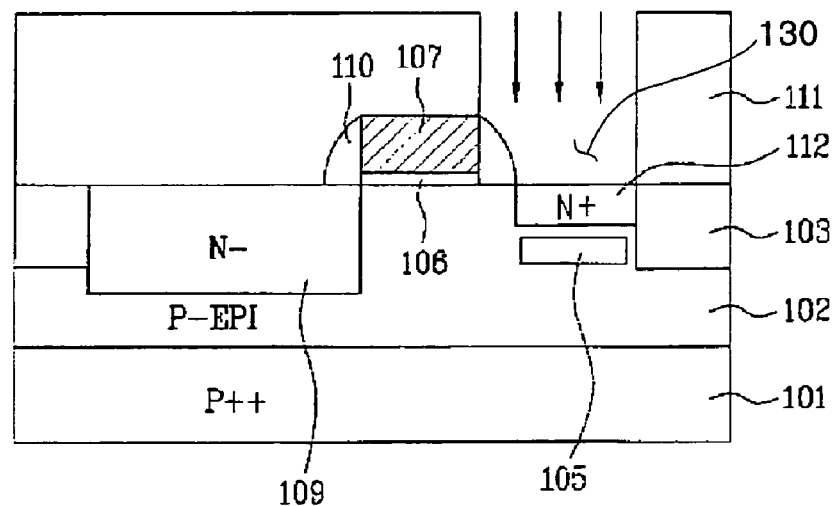

Then, referring to FIG. 12, after depositing an insulating layer on the entire surface of the semiconductor substrate 101 including the gate electrode 107, the insulating layer can be subject to an etching process to form spacers 110 at both sides of the gate electrode 107.

Thereafter, a third photoresist film 111 can be coated on the semiconductor substrate 101 and patterned to expose a source/drain region 130 of a transistor.

Next, high-density second conductive type (in this case N+ type) dopants can be implanted into the exposed source/drain region 130 using the third photoresist film 111 as a mask to form n+ type diffusion region (FD region) 112.

Figure 13:
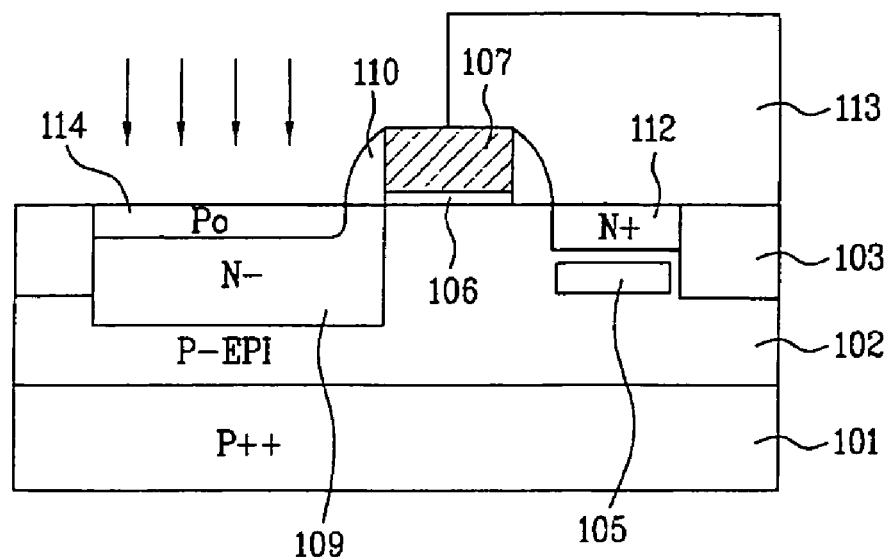

Referring to FIG. 13, after removing the third photoresist film 111, a fourth photoresist film 113 can be coated on the entire surface of the semiconductor substrate 101, and patterned to expose the PD region.

Then, first conductive type (in this case Po− type) dopants can be implanted into the epitaxial layer 102 formed with the second conductive type diffusion region 109 by using the fourth photoresist film 113 as a mask to form a first conductive diffusion region 114 in the epitaxial layer 102.

Figure 14:
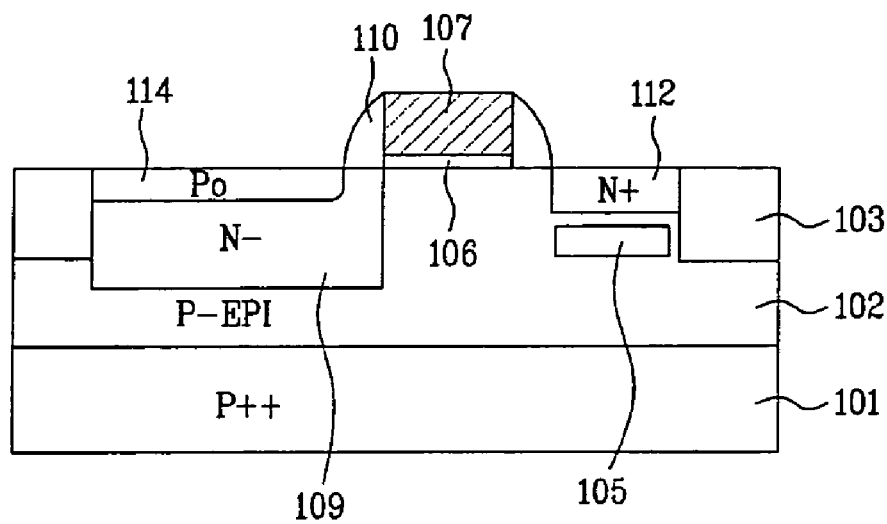

Thereafter, as shown in FIG. 14, after the fourth photoresist film 113 is removed, a heat treatment process can be performed with respect to the semiconductor device 101 such that implanted dopants are diffused.

Optical charges generated in a first conductive type diffusion region 114 or the second conductive type diffusion region 109 move to the FD region 112.

Although it is not illustrated in figures, metal lines and an inter-layer dielectric layer can be formed on the entire surface of the semiconductor substrate, and a color filter layer and a micro lens can be formed to complete an image sensor.

Although a preferred embodiment of the present invention has been described for illustrative purposes, those skilled in the art will appreciate that various modifications, additions and substitutions are possible, without departing from the scope and spirit of the invention as disclosed in the accompanying claims.

I claim:

1. A CMOS image sensor comprising:
   a semiconductor substrate;
   a gate electrode formed on the semiconductor substrate;
   a conductive diffusion region formed in a photodiode area of the semiconductor substrate;
   a floating diffusion region formed in a transistor area of the semiconductor substrate; and
   an oxide region formed in the transistor area of the semiconductor substrate only below the floating diffusion region.

2. The CMOS image sensor according to claim 1, wherein the oxide region is connected to the floating diffusion region.

3. The CMOS image sensor according to claim 1, wherein the semiconductor substrate is formed with an epitaxial layer, which is grown through an epitaxial process, wherein the oxide region is formed in the epitaxial layer.

4. The CMOS image sensor according to claim 1, wherein the conductive diffusion region comprises a first conductive type diffusion region and a second conductive type diffusion region, wherein the first conductive type diffusion region is above the second conductive type diffusion region.

5. The CMOS image sensor according to claim 1, wherein the semiconductor substrate comprises p type dopants.

6. The CMOS image sensor according to claim 1, wherein the floating diffusion region comprises high-density N+ type dopants.

7. The CMOS image sensor according to claim 4, wherein the first conductive type diffusion region comprises p type dopants, and the second conductive type diffusion region comprises n type dopants.

8. A CMOS image sensor comprising:
   a semiconductor substrate;
   an epitaxial layer grown on the semiconductor substrate through an epitaxial process;
   a conductive diffusion region formed in the epitaxial layer so as to generate optical charges when light is incident thereto;
   a floating diffusion region to which the optical charges generated from the conductive diffusion region move, wherein the floating diffusion region is disposed in a region of the epitaxial layer to a side of the conductive diffusion region; and
   an oxide region formed below the floating diffusion region, wherein the oxide region is formed in the epitaxial layer and disposed in the region of the epitaxial layer to the side of the conductive diffusion region.

9. The CMOS image sensor according to claim 8, wherein the oxide region reduces node capacitance of the floating diffusion region.

10. The CMOS image sensor according to claim 8, wherein the floating diffusion region comprises high-density N+ type dopants.

11. The CMOS image sensor according to claim 8, wherein the conductive diffusion region comprises a first conductive type diffusion region and a second conductive type diffusion region, wherein the first conductive type diffusion region is formed above the second conductive type diffusion region in the epitaxial layer.

12. A method for manufacturing a CMOS image sensor, the method comprising:
    implanting oxygen-based dopants into a predetermined area of a transistor region of a semiconductor substrate;
    forming a gate electrode on the transistor region of the semiconductor substrate with a gate insulating layer formed therebetween;
    forming a second conductive type diffusion region by implanting dopants into a photodiode region of the semiconductor substrate; and
    forming a floating diffusion region by implanting dopants into the predetermined area of the transistor region, the determined area having the implanted oxygen-based dopants, wherein the implanted oxygen-based dopants are formed only below the floating diffusion region in the predetermined area.

13. The method according to claim 12, further comprising after implanting the oxygen-based dopants, performing an oxidation process to form an oxide region in the semiconductor substrate.

14. The method according to claim 12, further comprising forming a first conductive type diffusion region in the photodiode region of the semiconductor substrate to a depth less than that of the second conductive type diffusion region.

15. The method according to claim 12, wherein forming the second conductive type diffusion region comprises implanting high density N-type dopants.

16. The method according to claim 12, wherein implanting the oxygen-based dopants into the predetermined area of the transistor region comprises:
    forming a photoresist pattern exposing a region of the semiconductor substrate for the floating diffusion region; and
    implanting the oxygen-based dopants into the region of the semiconductor substrate for the floating diffusion region using the photoresist pattern as an implantation mask.

* * * * *